(12) United States Patent
Wang et al.

(10) Patent No.: US 9,164,399 B2
(45) Date of Patent: Oct. 20, 2015

(54) RETICLE OPERATION SYSTEM

(71) Applicant: Hermes-Microvision, Inc., Hsinchu (TW)

(72) Inventors: Youjin Wang, Milptas, CA (US); Chiyan Kuan, Danville, CA (US); Chung-Shih Pan, Palo Alto, CA (US)

(73) Assignee: HERMES-MICROVISION, INC., Hsinchu (TW)

( * ) Notice: Subject to any disclaimer, the term of this patent is extended or adjusted under 35 U.S.C. 154(b) by 403 days.

(21) Appl. No.: 13/737,065

(22) Filed: Jan. 9, 2013

(65) Prior Publication Data

US 2013/0176549 A1    Jul. 11, 2013

Related U.S. Application Data

(60) Provisional application No. 61/584,945, filed on Jan. 10, 2012.

(51) Int. Cl.
| | | |
|---|---|---|
| *G03B 27/62* | (2006.01) | |
| *G03F 7/20* | (2006.01) | |
| *G03F 1/66* | (2012.01) | |
| *G03B 27/32* | (2006.01) | |

(52) U.S. Cl.
CPC .............. *G03F 7/70741* (2013.01); *G03F 1/66* (2013.01); *G03F 7/70733* (2013.01)

(58) Field of Classification Search
CPC ............ G03F 7/70733; G03F 7/70741; G03F 7/70841; G03F 7/70858; G03F 7/70975; G03F 7/70991; G03F 7/2037; G03F 7/2039; G03F 1/66
USPC .......... 355/75–77; 430/5, 8, 22, 30, 311, 312, 430/321, 394; 250/492.1, 492.2, 492.22, 250/493.1, 548
See application file for complete search history.

(56) References Cited

U.S. PATENT DOCUMENTS

| | | | | |
|---|---|---|---|---|
| 5,314,068 | A * | 5/1994 | Nakazato et al. ............. | 206/454 |
| 5,746,562 | A * | 5/1998 | Hasegawa et al. ............ | 414/217 |
| 6,048,655 | A * | 4/2000 | Nakahara ........................ | 430/22 |
| 7,962,242 | B1 * | 6/2011 | Aho et al. ...................... | 700/251 |
| 2001/0005944 | A1 * | 7/2001 | Dao et al. ......................... | 34/412 |
| 2003/0082030 | A1 * | 5/2003 | del Puerto et al. ............ | 414/217 |
| 2004/0017556 | A1 * | 1/2004 | Nakahara ........................ | 355/70 |
| 2006/0018748 | A1 * | 1/2006 | Tran ............................... | 414/758 |
| 2006/0066834 | A1 * | 3/2006 | Phillips et al. .................. | 355/75 |
| 2006/0177287 | A1 * | 8/2006 | Wu et al. ........................ | 414/217 |
| 2007/0002516 | A1 * | 1/2007 | Matsumoto .................... | 361/234 |
| 2011/0121193 | A1 * | 5/2011 | Braude et al. ................. | 250/372 |
| 2011/0180108 | A1 * | 7/2011 | Pan et al. ......................... | 134/21 |

* cited by examiner

*Primary Examiner* — Christina Riddle
(74) *Attorney, Agent, or Firm* — WPAT, PC; Justin King

(57) ABSTRACT

A system for operating EUV mask stored in reticle SMIF pod and/or dual pod is provided, wherein the reticle SMIF pod and Dual pod are for storing EUV mask. The system can be a sorter for EUV mask transferred from reticle SMIF pod into dual pod, and vice versa, or an operating system for tools relating to EUV mask, wherein the tools may be EUV lithography, or inspection tool for inspecting EUV mask.

7 Claims, 7 Drawing Sheets

Particle Evaluation

| Item | Condition | Atmosphere Solution | | Vacuum Solution | |
|---|---|---|---|---|---|
| | | Mask In | Mask Out | Mask In | Mask Out |
| 1 | Clean mask to inspect | √ | √ | √ | √ |
| 2 | Dirty mask to inspect | x | x | √ | √ |
| 3 | Charge after inspection | - | x | - | √ |

Figure 8

RETICLE OPERATION SYSTEM

CLAIM OF PRIORITY

This application claims the benefit of priority of U.S. provisional application No. 61/584,945 entitled to inventors filed Jan. 10, 2012 and entitled "System for Operating RSP/Dual Pod", the entire disclosures of which are incorporated herein by reference.

FIELD OF THE INVENTION

The present invention relates to a reticle operation system, and more particularly to a system and method for operating EUV mask before the EUV mask is processed.

BACKGROUND OF THE INVENTION

Reticle SMIF pod (RSP) is used for storing mask in a small housing with ultimate clean. However, for storing EUV mask or EUV reticle, requirement of clean is extremely crucial than conventional reticle SMIF pod and dual pod is therefore provided. As shown in FIG. 1, the dual pod 10 includes two pods, in which one is an outer pod 14 compatible to original reticle SMIF pod, and the other one is an inner pod 12 or EUV pod for storing EUV mask. The inner pod 12, just a little larger than the EUV mask, can be placed into the outer pod 14. Although the dual pod is better for storing EUV mask, however, in order to facilitate with dual pod, all equipments in a semiconductor industry will be designed again. That would induce much more cost.

Now, in semiconductor industry, some companies may need dual pod, but some other companies may not need dual pod. For the two kinds of pods, a sorter is used as an interface for operating the two kinds of pods. For example, if a vendor provides an EUV mask stored inside the dual pod while only conventional RSP is available in the manufacture company, or vice versa, the sorter can be used to place the EUV mask from the dual pod into the RSP, or vice versa.

A system 20 for processing mask, such as inspecting the mask or illuminating the mask in lithography process, with sorter is shown in FIG. 2, wherein the system 20 includes a sorter 22, a transfer chamber 32, and a processing chamber 36. The sorter 22, in air condition, includes a dual pod port 24 for loading/unloading the dual pod, a RSP port 26 for loading/unloading the RSP, an opener chamber 28 for opening inner pod of the dual pod, and a chamber that the dual pod port 24, RSP port 26, and opener chamber 28 connecting thereto. Sorter 22 is used for EUV mask transferred from reticle SMIF pod to dual pod or vice versa. If an EUV mask stored in a dual pod and will be transferred into RSP, a solid curve line indicates the EUV mask transferring procedure, or vice versa.

A load/lock 30 connecting to the chamber of the sorter 22 will provide an interface for reticle between the air condition and class 1 vacuum condition, or air condition and class 1 vacuum condition for ebeam inspection. A dash line in FIG. 2 across the load/lock 30 denotes the interface between air and vacuum. A transfer chamber 32, with an opener chamber 34 connecting thereto, connecting to the load/lock 30 for receiving EUV mask or inner pod of the dual pod before the EUV mask enters the processing chamber 36. Transfer chamber 32 is used for transferring EUV mask from reticle SMIF pod or dual pod into processing tool, such as lithography or inspection tool.

For EUV mask stored in reticle SMIF pod, a port for reticle SMIF pod is ready to load, and directly transferred into E-chuck via transfer chamber for litho use. As shown in FIG. 2, for an EUV mask stored inside the RSP, the RSP is loaded to the RSP port 26 and the EUV mask is then took off through the load/lock 30 into the processing chamber 36 directly. Such a procedure can be referred to the dash curve line in FIG. 2.

For EUV mask stored in dual pod, EUV mask is passed into opener chamber in the transfer chamber to open the inner pod. As shown in FIG. 2, for an EUV mask stored in the dual pod, the dual pod will be loaded on the dual port 24 and the inner pod will be loaded through the load/lock 30 to the opener chamber 34 connecting to the transfer chamber 32. Then, the inner pod is opened and the EUV mask inside the inner pod is then took off, and transferred to the processing chamber 36. This procedure can be referred to the dot-dash line in FIG. 2.

EUV mask, in lithography use, always faces down; however, the EUV mask has to be flipped for inspection purpose. Hence, a flipper should be included in the chamber of the sorter 22. Further, the EUV mask has a square outline, and has to be turned by angles. Therefore, a turn table is also included in the chamber of the sorter 22.

Although the system 20 as shown in FIG. 2 provides a good interface for both dual pod and RSP, it occupied too large footprint. Moreover, the system 20 is also too complex that will increase cost for foundry. Therefore, a new system is needed for small footprint with simple mechanism.

SUMMARY OF THE INVENTION

One object of this invention is to provide a system with better clean requirement for operating EUV mask.

Another object of this invention provides a system with small footprint for operating EUV mask.

The present invention provides a reticle operation system which comprises a load port for loading a RSP or a dual pod, an inner opener for opening an inner pod of the dual pod, and an operation chamber, in air condition, connecting to the load port and the inner opener. The operation chamber includes a robot for taking a first mask inside the RSP attached to the load port into the operation chamber, or transfers the inner pod from the dual pod attached to the load port into the inner opener, such that a second mask inside the inner pod can be taken out into the operation chamber.

The first mask and the second mask are EUV reticles. The operation chamber may include a flipper for flipping the first mask or the second mask and a turn table for rotating the first mask or the second mask after the first mask or the second mask is loaded into the operation chamber. The operation chamber connects to a load/lock chamber for transferring the first mask or the second mask from the operation chamber to a processing chamber, wherein the load/lock chamber is sandwiched by two valves.

The present invention also provides a system for operating an EUV mask which comprises a pre-operation tool in air condition, a load/lock chamber for receiving a first EUV mask or an inner pod, and an operation tool in vacuum condition. The pre-operation tool includes a load port for loading a RSP or a dual pod, and a pre-operation chamber, connecting to the load port, including an air robot inside the pre-operation chamber. The air robot will take the first EUV mask out of the RSP or the inner pod out of the dual pod. The load/lock chamber connects to the pre-operation tool as an interface between air condition and vacuum condition. The operation tool includes an operation chamber connecting to the load/lock chamber, an inner opener connecting to the operation chamber, and a valve between the operation chamber and a processing tool. The operation chamber includes a vacuum robot inside the operation chamber, wherein the vacuum robot will take the first EUV mask or the inner pod inside the load/lock chamber into the operation chamber. A second EUV mask inside the inner pod can be taken out in the inner opener.

The operation tool includes a flipper which connects to the operation chamber, for flipping the first EUV mask or the second EUV mask. The operation tool also includes a turn table which connects to the operation chamber, for rotating the first EUV mask or the second EUV mask after the first EUV mask or the second EUV mask is loaded into the operation chamber. The system further comprises a bellow between the operation chamber and the valve. The load/lock chamber is sandwiched by two valves.

The present invention also provides another system for operating an EUV mask which comprises a load port for loading a RSP or a dual pod, a mini environment chamber connecting to the load port, a first valve connecting to the mini environment chamber, an operation tool in air condition before the EUV mask is operated and in vacuum condition when the EUV mask is operating, and a second valve between the operation tool and a processing tool. The operation tool includes an operation chamber which connects to the first valve, including a robot inside the operation chamber, and an inner opener which connects to the operation chamber, for taking a second EUV mask out of the inner pod. The robot will take a first EUV mask inside the RSP or an inner pod inside the dual pod.

The operation tool includes a flipper which connects to the operation chamber, for flipping the first EUV mask or the second EUV mask. The operation tool also includes a turn table which connects to the operation chamber, for rotating the first EUV mask or the second EUV mask after the first EUV mask or the second EUV mask is loaded into the operation chamber. The system further comprises a bellow between the operation chamber and the second valve.

The present invention still provides a method for operating the first mask to the dual pod which comprises steps of loading the dual pod to said load port; taking the inner pod from the dual pod in said inner opener; opening the inner pod and placing the second mask on said turn table; returning the inner pod to the dual pod; unloading the dual pod from said load port; loading the RSP to the load port; and placing the second mask in the RSP.

The present invention still provides a method for operating the second mask to the RSP which comprises steps of loading the dual pod to said load port; taking the inner pod from the dual pod in said inner opener; opening the inner pod and placing the second mask on said turn table; returning the inner pod to the dual pod; unloading the dual pod from said load port; loading the RSP to the load port; and placing the second mask in the RSP.

BRIEF DESCRIPTION OF THE DRAWINGS

The present invention will be readily understood by the following detailed description in conjunction with the accompanying drawings, wherein like reference numerals designate like structural elements, and in which:

FIG. 8 is a table to illustrate particle evaluation of each embodiment of the present invention.

DETAILED DESCRIPTION OF THE INVENTION

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well known process operations are not described in detail in order not to unnecessarily obscure the present invention.

Because the EUV mask can be stored in RSP or dual pod, a system for operating the EUV mask must be provided before the EUV mask is processed, such as patterning in lithographic process or inspected by an inspection tool. This system has to adapt both RSP and dual pod, and to take the EUV mask out in RSP or even in dual pod. For purpose of all processes, the EUV mask can be flipped or rotated. If the EUV mask should be transferred from RSP to dual pod, or vise versa, this system can provide a method for such a transfer. Basically, a sorter also provides a function of such transfer.

Three embodiments are provided in this invention, with one embodiment with sorter in air environment and two embodiments with operation system in vacuum environment.

Figure 1:
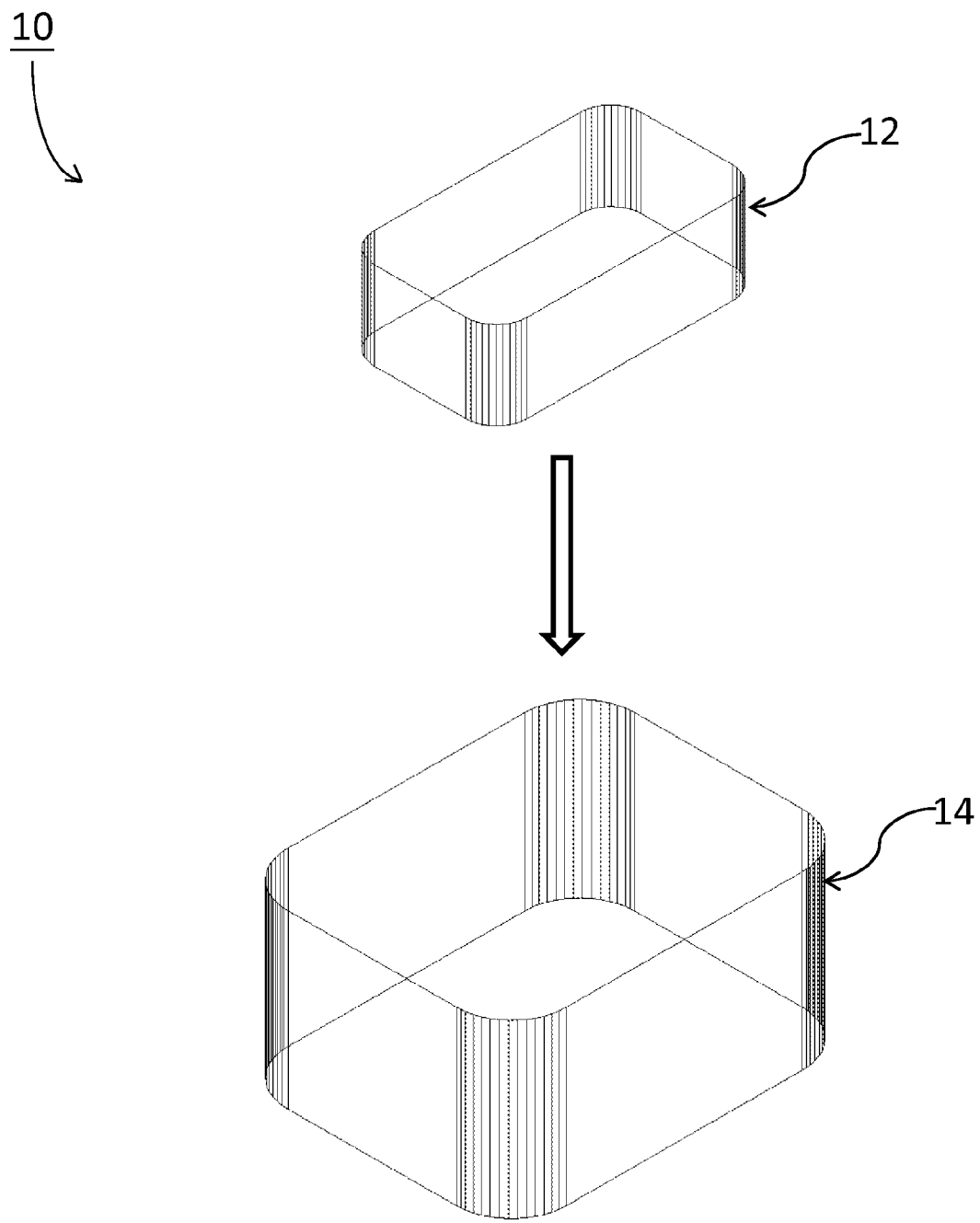
FIG. 1 is a schematic diagrammatic representation of a dual pod including an EUV pod and a Reticle SMIF pod.
Figure 2:
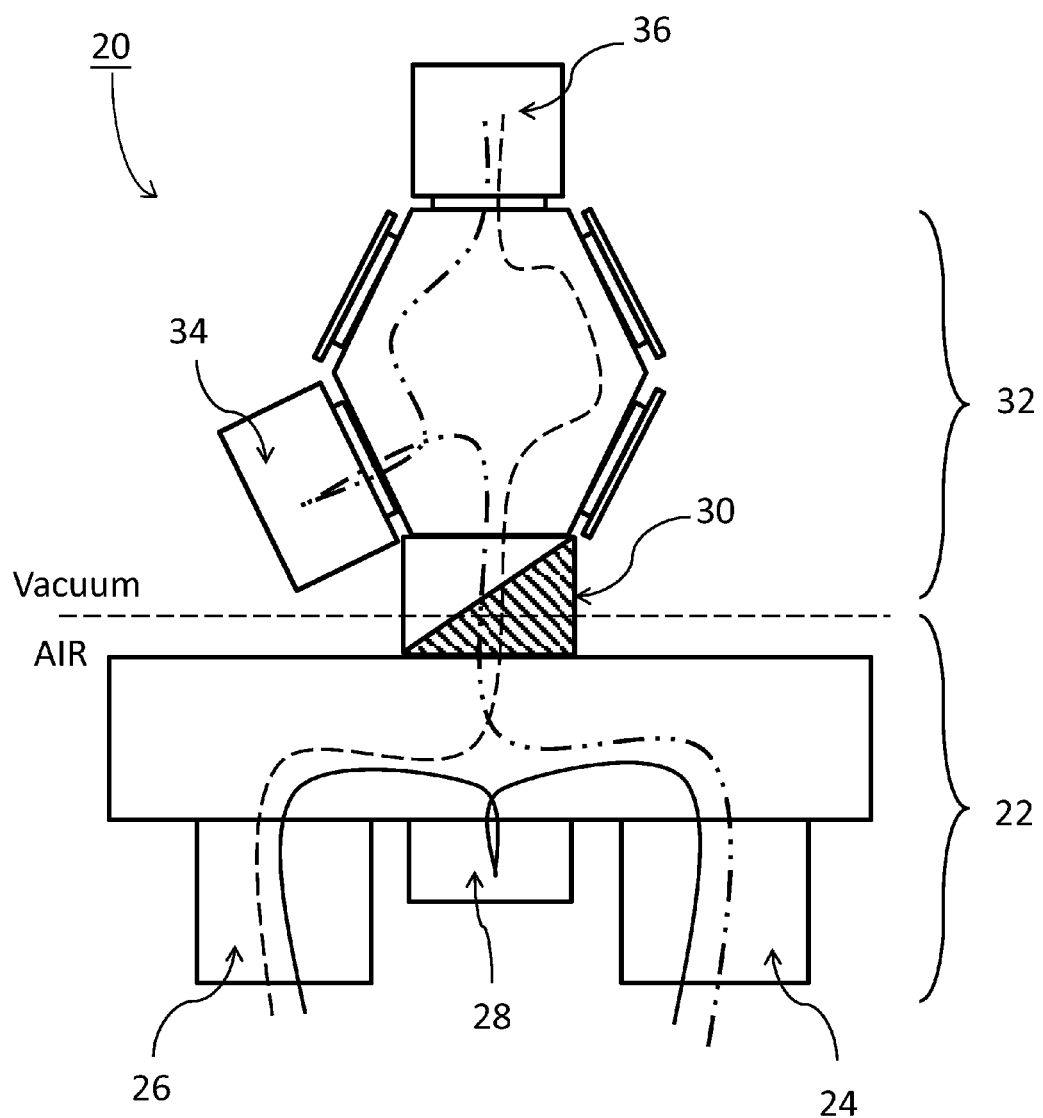
FIG. 2 is a schematic diagrammatic representation of a conventional dual pod operation system.
Figure 3:
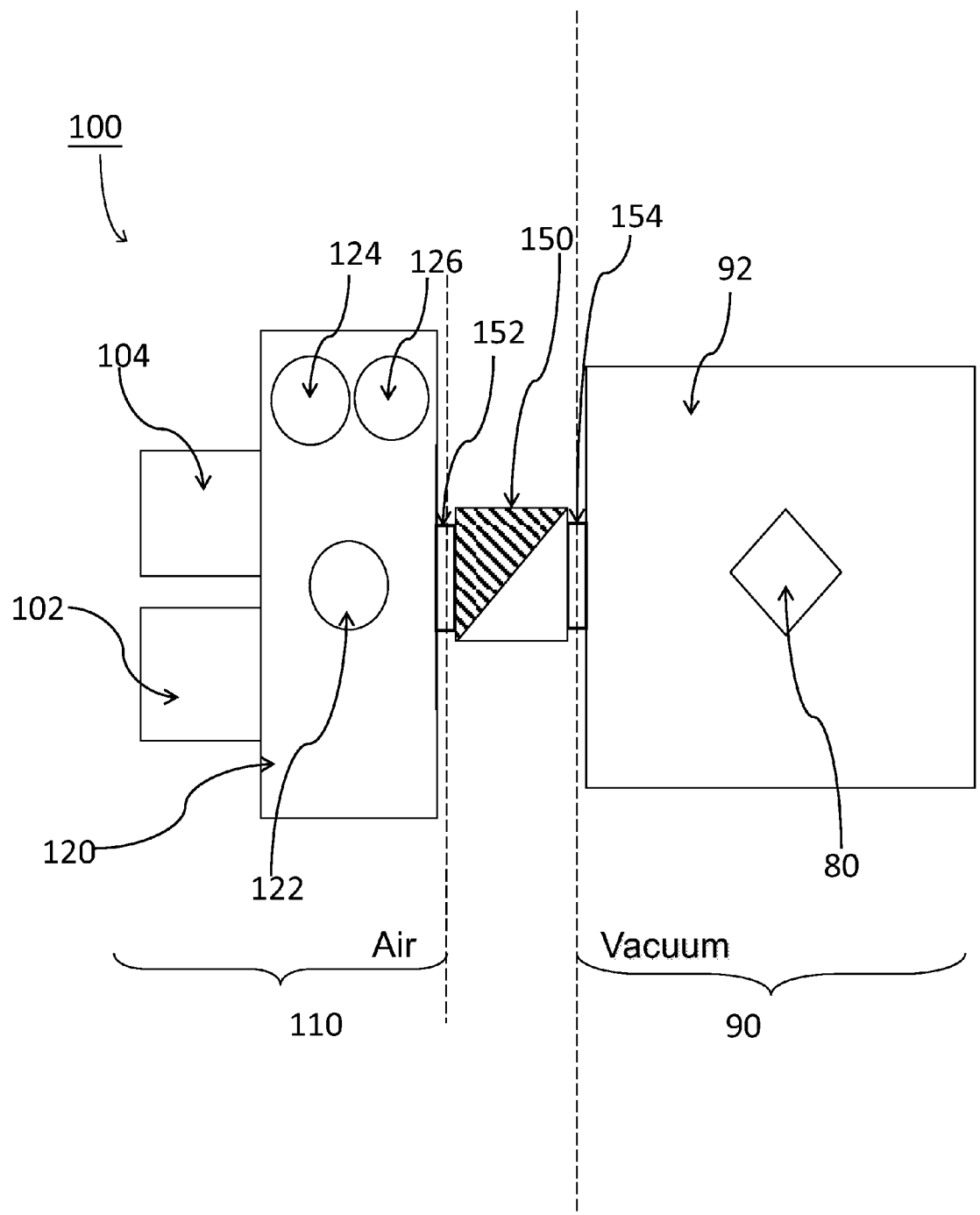
FIG. 3 is a schematic diagrammatic representation of a dual pod operation system under air condition in accordance with one embodiment of the present invention.

Please refer to FIG. 3, a system 100 for processing EUV mask is provided, which includes a sorter 110 under air condition and a processing tool 90. In this embodiment, the sorter 110 combines the function of transfer chamber 32 in FIG. 2, and by using a load/lock chamber 150, the EUV mask can be transferred into processing chamber 92 directly. A RSP/dual pod load port 102 is designed for receiving both the RSP and dual pod and connects to an operation chamber 120, wherein the operation chamber 120 is a mini environment. The mini environment is a local, small space which should be kept at ultra high clean, such as class 1 or even class 0.1, such that cost of clean room can be much more reduced. An inner opener chamber 104, also connecting to the operation chamber 120, is designed for opening the inner pod of the dual pod and taking the EUV mask out of the inner pod. A turn table 124 and a flipper 126, both inside the operation chamber 120, are processed with respective function. For example, the turn table 124 is designed for rotating the EUV mask with 45 degree, and the flipper 126 is used for flipping the EUV mask if the later processing tool 90 is for inspection tool. A robot 122, in the operation chamber 120 and under air condition, is used for taking/receiving EUV mask from the RSP/dual pod port 102, inner opener chamber, turn table 124, and flipper 126. The robot 122 may further transfer the EUV mask into next station via the load/lock chamber 150.

Two valves 152 and 154, sandwiched the load/lock chamber 150, provide the load/lock chamber 150 a suitable interface between the sorter 110 and the processing tool 90; particularly while the processing tool 90 is the ebeam inspection tool, the entire processing tool 90 requires vacuum environment. When the EUV mask is put into the load/lock chamber 150, another robot in the processing tool 90 will take the EUV mask away the load/lock chamber 150 and put the EUV mask into the processing chamber 92. The EUV mask 80 in the processing chamber 92 can be used for patterning process if the processing tool 92 is lithography tool. The processing tool 92 in the present invention may also be an ebeam inspection tool for inspection if there is any defect or particle on the EUV mask 80.

Figures 4, 5:
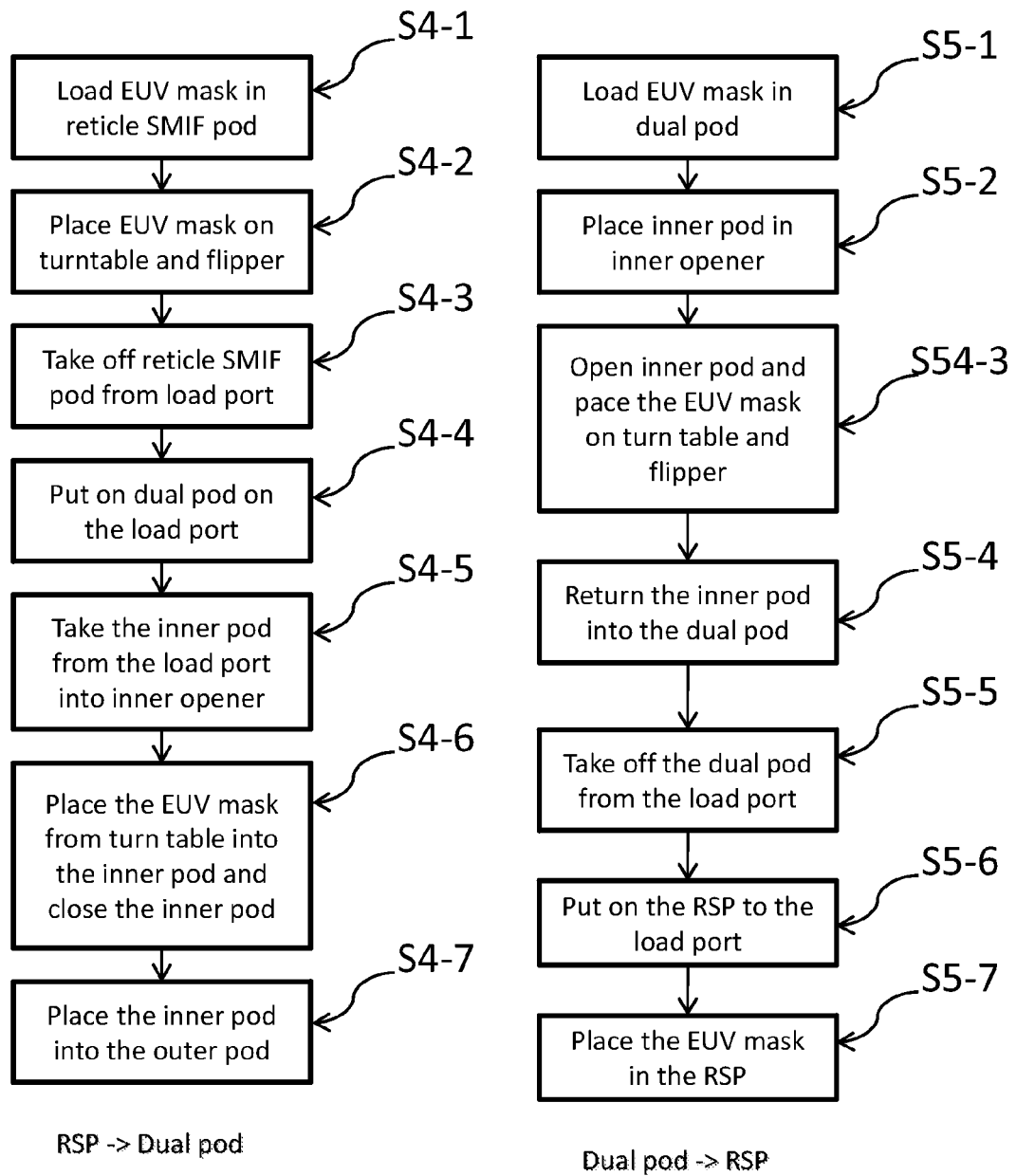
FIG. 4 is a flow chart for transferring a mask from RSP to dual pod by using the present invented dual pod operation system.
FIG. 5 is a flow chart for transferring a mask from dual pod to RSP by using the present invented dual pod operation system.

The EUV mask inside either RSP or dual pod can be transferred by using the sorter 110. The whole procedure can be referred to FIG. 4 and FIG. 5. In FIG. 4, the EUV mask is stored in the RSP and would be transferred to the dual pod. In the first step S4-1, the RSP (reticle SMIF pod) within the EUV mask is loaded to the RSP/dual pod load port, and the EUV mask is loaded out of the RSP. Then, the EUV mask is placed on the turn table and/or flipper, as shown in the second step S4-2. In the third step S4-3, the RSP is taken off or unloaded from the load port. Next, the dual pod is put on the load port as shown in step 4-4. In the fifth step S4-5, the inner pod is taken from the load port into the inner opener chamber. The EUV mask is then placed from the turn table and/or flipper into the inner pod and the inner pod is closed, as shown in step S4-6. Next, the inner pod is placed into outer pod of the dual pod, as shown in the step S4-7, and later the dual pod can be unloaded from the load port.

For detailed procedure about the EUV mask transferred from the dual pod to the RSP, please refer to the FIG. 5. First, in the step 5-1, the EUV mask in the dual pod is then loaded on the load port. Then, the inner pod is taken off the dual pod and placed into the inner opener chamber, shown in step 5-2. Next, the inner pod is opened and the EUV mask is taken out and placed on the turn table and/or flipper. In the step S5-4, the inner pod in the inner opener chamber is then closed and returned to the dual pod, and the dual pod is then taken off or unloaded from the load port, as shown in step S-505. Then, RSP is put or loaded on the load port, as shown in step S5-6. In step S5-7, the EUV mask is then placed into the RSP, and later the RSP with EUV mask can be unloaded.

Figure 6:
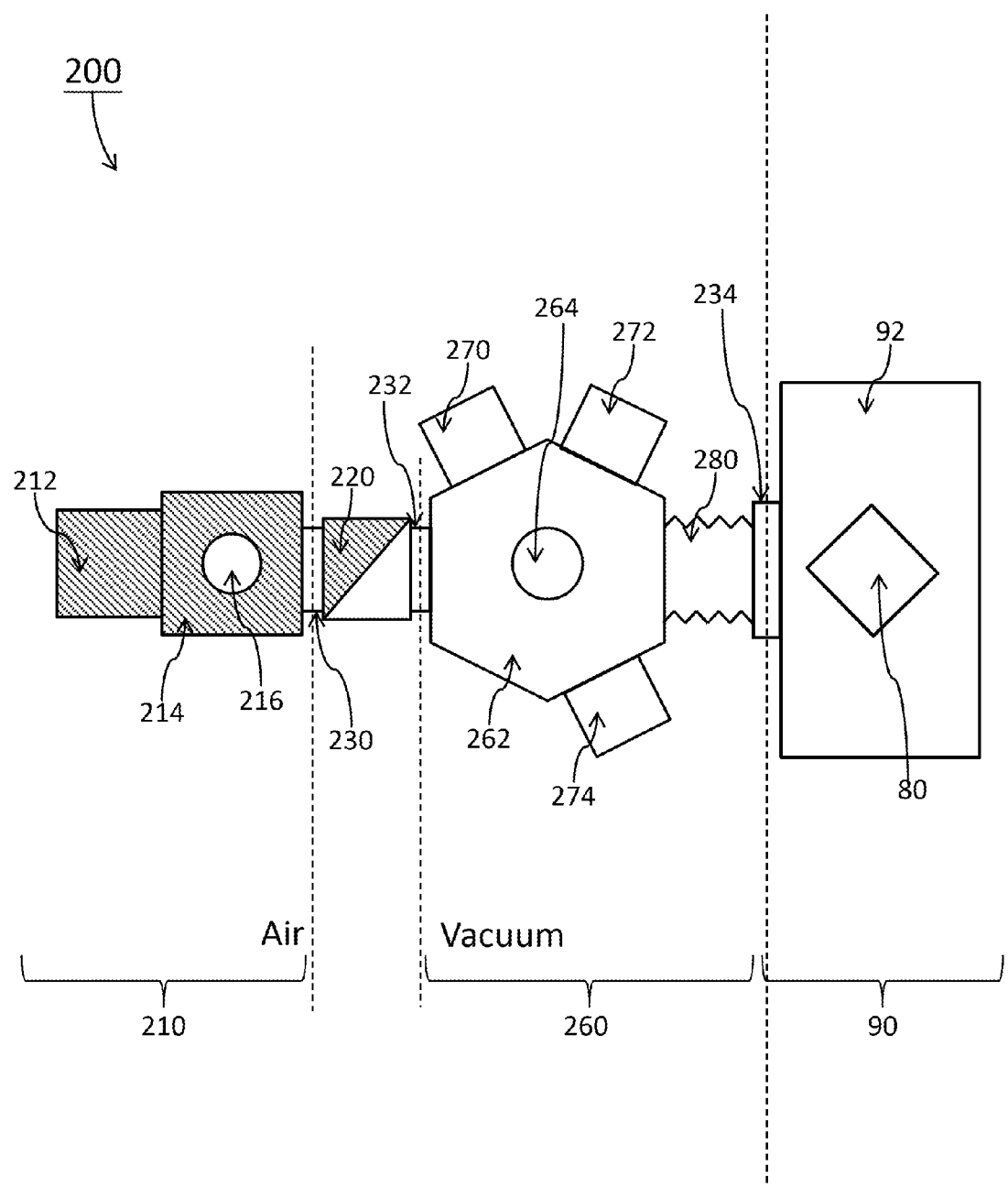
FIG. 6 is a schematic diagrammatic representation of a dual pod operation system under vacuum condition in accordance with one embodiment of the present invention.

This invention provides another embodiment that EUV mask is operated under vacuum, that a better solution for sorter can be provided. Please refer to FIG. 6, a system 200 for operating EUV mask is provided, which includes a pre-operation tool 210, and an operation tool 260. The pre-operation tool 210, under air condition, includes a RSP/dual pod load port 212, a pre-operation chamber 214 connecting to the load port 212. The pre-operation chamber 214, including an air robot 216, is a mini environment 218, wherein the air robot 216 indicates that the robot 216 is operated under air condition.

A load/lock chamber 220, sandwiched by two valves 230 and 232, is between the pre-operation chamber 216 and an operation chamber 262 of the operation tool 260. The load/lock chamber 220 provides an interface between the pre-operation tool 210 and the operation tool 260, such that EUV mask can be transferred from air condition to vacuum condition.

The operation tool 260, under vacuum condition, includes an operation chamber 262, and three chambers 270, 272, and 274 connecting to the operation chamber 262. The first chamber 270 is an inner opener for opening the inner pod, the second chamber 272 is a turn table for rotating the EUV mask a 45 degree or other orientations, and the third chamber 274 is a flipper for flipping the EUV mask upside down. A vacuum robot 264 inside the operation chamber 262 will take the EUV mask or inner pod from the load/lock chamber 220 and operation among the three chambers 270, 272, and 274. The EUV mask is then put into the processing tool 90 by the vacuum robot 264. The vacuum robot 264 means that the robot will be operated under vacuum environment and an ultimate clean requirement can be provided. A bellow 280, connecting between the operation chamber 262 and a valve 234, is provided. The processing chamber 92, like previous embodiments, can be functioned as lithography or inspection. The EUV mask 80 inside the processing chamber 92 is the processed.

The pre-operation tool 210 and the operation tool 260 combined together will provide a function of sorter under vacuum environment; that means a better operation cleaning can be provided. All procedures for transferring the EUV mask from RSP to the dual pod or vice versa can be referred to FIG. 4 and FIG. 5.

Figure 7:
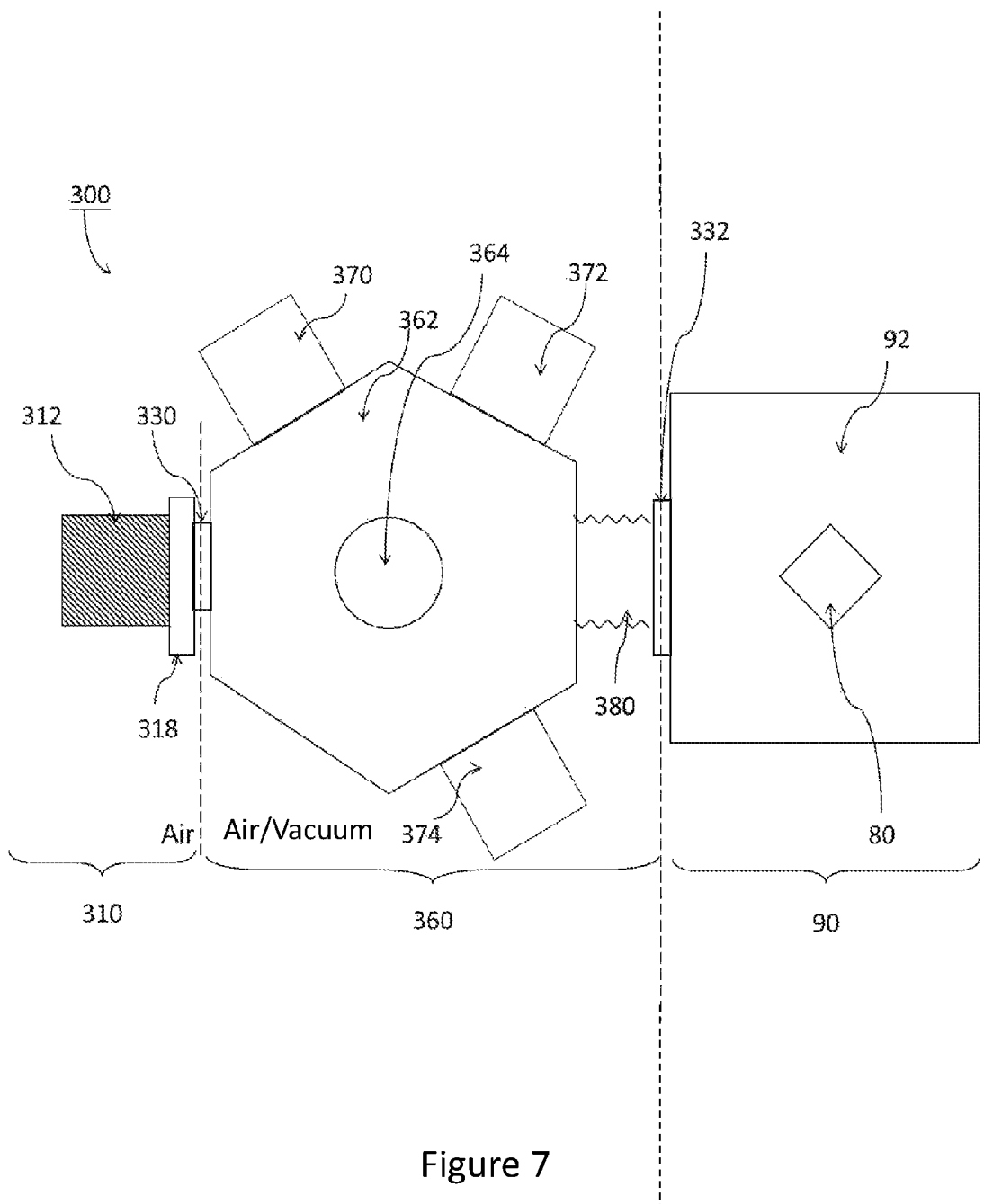
FIG. 7 is a schematic diagrammatic representation of a dual pod operation system under vacuum condition in accordance with another embodiment of the present invention.

Another embodiment of the present invention is provided as shown in FIG. 7, in which a smaller footprint, compared to the second embodiment, is provided. A system 300 for processing EUV mask includes a pre-operation tool 310, and an operation tool 360. The pre-operation tool 310 includes a RSP/dual pod load port 312 and a chamber 318 that is a mini environment. The operation tool 360, sandwiched by two valves 330 and 332, functions like a load/lock chamber in the second embodiment. The operation tool 360 includes an operation chamber 362, and a robot 364 inside the operation chamber 362. Three chambers 370, 372, and 374 connecting to the operation chamber 362, include an inner opener 370, a turn table 372, and a flipper 374. The EUV mask or inner pod is taken by the robot 364 from the mini environment chamber 318. Then, the two valves will be closed and the operation chamber is then vacuumed. The EUV mask is then operated in the operation tool 360.

A bellow 380 between the operation chamber 362 and a valve 332 provides connection therebetween. The processing chamber 92, like previous embodiments, can be functioned as lithography or inspection. The EUV mask 80 inside the processing chamber 92 is processed.

The pre-operation tool 310 and the operation tool 360 combined together will provide a function of sorter under vacuum environment; that means a better operation cleaning can be provided. All procedures for transferring the EUV mask from RSP to the dual pod or vice versa can be referred to FIG. 4 and FIG. 5.

EUV mask, under litho process, will incur a lot of particles due to the E-chuck. In FIG. 8, a table is provided to illustrate that the three embodiments will result different conditions. For a sorter under air condition, a clean EUV mask will incur less issue no matter the mask is put in or taken out. However, for a dirty mask to be inspected, particle issue may be induced, and charge issue is also existed in such a case.

For a sorter under vacuum condition, there will incur no particle issue even the mask is dirty. Charged is not easy to be identified when the EUV mask is put in, but there will incur less, even no charge issue after the EUV mask is taken out.

Thus, in this invention, a system for operating EUV mask with better, even ultimate clean requirement can be matched to industrial manufacturing purpose; especially for the EUV mask is operated under vacuum condition. Even if one embodiment of a system is operated under air condition, this system in this invention can reach a balance between cost and footprint.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended.

What is claimed is:

1. A reticle operation system, comprising:
   a load port for loading a reticle SMIF pod (RSP) or a dual pod;
   an inner opener for opening an inner pod of the dual pod; and
   an operation chamber, in air condition, connecting to said load port and said inner opener, said operation chamber including a robot for taking a first mask inside said RSP attached to said load port into said operation chamber, or transferring the inner pod from the dual pod attached to said load port into said inner opener, such that a second mask inside said inner pod can be taken out into said operation chamber;
   wherein the first mask and the second mask are EUV reticles;
   wherein said operation chamber includes a flipper for flipping the first mask or the second mask;
   wherein said operation chamber includes a turn table for rotating the first mask or the second mask after the first mask or the second mask is loaded into the operation chamber;
   wherein said operation chamber connects to a load/lock chamber for transferring the first mask or the second mask from the operation chamber to a processing chamber, said load/lock chamber being sandwiched by two valves; and
   wherein a method for operating the first mask to the dual pod comprises steps of:
   loading the RSP to said load port;
   taking the first mask from the RSP on said turn table;
   unloading the RSP from said load port;
   loading the dual pod to the load port;
   taking the inner pod out of the dual pod from the load port into said inner opener;
   placing the first mask into the inner pod and closing the inner pod; and
   placing the inner pod into the dual pod.

2. The reticle operation system according to claim 1, wherein a method for operating the second mask to the RSP comprises steps of:
   loading the dual pod to said load port;
   taking the inner pod from the dual pod in said inner opener;
   opening the inner pod and placing the second mask on said turn table;
   returning the inner pod to the dual pod;
   unloading the dual pod from said load port;
   loading the RSP to the load port; and
   placing the second mask in the RSP.

3. A system for operating an EUV mask, comprising:
   a pre-operation tool in air condition, which includes:
      a load port for loading a RSP or a dual pod; and
      a pre-operation chamber, connecting to said load port, including an air robot inside said pre-operation chamber, said air robot taking a first EUV mask out of said RSP or an inner pod out of said dual pod;
   a load/lock chamber, connecting to said pre-operation tool as an interface between air condition and vacuum condition, for receiving the first EUV mask or the inner pod; and
   an operation tool in vacuum condition, which includes:
      an operation chamber, connecting to said load/lock chamber, including a vacuum robot inside said operation chamber, said vacuum robot taking the first EUV mask or the inner pod inside the load/lock chamber into said operation chamber;
      an inner opener connecting to said operation chamber, such that a second EUV mask inside the inner pod can be taken out; and
   a valve between said operation chamber and a processing tool;
   wherein said operation tool includes a flipper, connecting to said operation chamber, for flipping the first EUV mask or the second EUV mask;
   wherein said operation tool includes a turn table, connecting to said operation chamber, for rotating the first EUV mask or the second EUV mask after the first EUV mask or the second EUV mask is loaded into the operation chamber;
   further comprising bellows between said operation chamber and said valve; and
   wherein a method for operating the first mask to the dual pod comprises steps of:
   loading the RSP to said load port;
   taking the first mask from the RSP on said turn table;
   unloading the RSP from said load port;
   loading the dual pod to the load port;
   taking the inner pod out of the dual pod from the load port into said inner opener;
   placing the first mask into the inner pod and closing the inner pod; and
   placing the inner pod into the dual pod.

4. The system according to claim 3, wherein said load/lock chamber is sandwiched by two valves.

5. The system according to claim 3, wherein a method for operating the second mask to the RSP comprises steps of:
   loading the dual pod to said load port;
   taking the inner pod from the dual pod in said inner opener;
   opening the inner pod and placing the second mask on said turn table;
   returning the inner pod to the dual pod;
   unloading the dual pod from said load port;
   loading the RSP to the load port; and
   placing the second mask in the RSP.

6. A system for operating an EUV mask, comprising:
   a load port for loading a RSP or a dual pod;
   a mini environment chamber connecting to said load port;
   a first valve connecting to said mini environment chamber;
   an operation tool in air condition before the EUV mask is operated and in vacuum condition when the EUV mask is operating, which includes:
      an operation chamber, connecting to said first valve, including a robot inside said operation chamber, said robot taking a first EUV mask inside said RSP or an inner pod inside said dual pod; and
      an inner opener, connecting to said operation chamber, for taking a second EUV mask out of said inner pod; and
   a second valve between said operation chamber and a processing tool;

wherein said operation tool includes a flipper, connecting to said operation chamber, for flipping the first EUV mask or the second EUV mask;

wherein said operation tool includes a turn table, connecting to said operation chamber, for rotating the first EUV mask or the second EUV mask after the first EUV mask or the second EUV mask is loaded into the operation chamber;

further comprising bellows between said operation chamber and said second valve;

wherein a method for operating the first mask to the dual pod comprises steps of:

loading the RSP to said load port;

taking the first mask from the RSP on said turn table;

unloading the RSP from said load port;

loading the dual pod to the load port;

taking the inner pod out of the dual pod from the load port into said inner opener;

placing the first mask into the inner pod and closing the inner pod; and placing the inner pod into the dual pod.

7. The system according to claim 6, wherein a method for operating the second mask to the RSP comprises steps of:

loading the dual pod to said load port;

taking the inner pod from the dual pod in said inner opener;

opening the inner pod and placing the second mask on said turn table;

returning the inner pod to the dual pod;

unloading the dual pod from said load port;

loading the RSP to the load port; and placing the second mask in the RSP.

* * * * *